United States Patent
Peng et al.

(10) Patent No.: US 9,086,553 B2
(45) Date of Patent: Jul. 21, 2015

(54) OPTICAL COMMUNICATIONS DEVICE HAVING ELECTRICAL BOND PADS THAT ARE PROTECTED BY A PROTECTIVE COATING, AND A METHOD FOR APPLYING THE PROTECTIVE COATING

(75) Inventors: Goh Han Peng, Singapore (SG); Phang Kah Yuan, Kluang Johor (MY); De Mesa Eduardo Alicaya, Singapore (SG)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 987 days.

(21) Appl. No.: 13/169,727

(22) Filed: Jun. 27, 2011

(65) Prior Publication Data

US 2012/0328303 A1    Dec. 27, 2012

(51) Int. Cl.
| H04B 10/00 | (2013.01) |
| H01L 23/48 | (2006.01) |
| H01L 21/50 | (2006.01) |
| G02B 6/42 | (2006.01) |
| H01L 23/00 | (2006.01) |

(52) U.S. Cl.
CPC ............. *G02B 6/4275* (2013.01); *H01L 24/49* (2013.01); *H01L 2224/48137* (2013.01); *H01L 2924/3011* (2013.01)

(58) Field of Classification Search
USPC ......................................................... 257/783
See application file for complete search history.

(56) References Cited

U.S. PATENT DOCUMENTS

| 4,696,526 A | 9/1987 | Newton et al. |
| 4,760,440 A | 7/1988 | Bigler et al. |
| 4,987,477 A | 1/1991 | Ikeno |
| 5,065,279 A | 11/1991 | Lazenby et al. |
| 5,436,492 A | 7/1995 | Yamanaka |
| 5,579,212 A | 11/1996 | Albano et al. |
| 5,637,923 A | 6/1997 | Kasai et al. |
| 5,907,189 A | 5/1999 | Mertol |
| 5,936,850 A | 8/1999 | Takahashi et al. |
| 5,956,576 A | 9/1999 | Toy et al. |
| 6,037,655 A | 3/2000 | Philbrick et al. |
| 6,225,689 B1 | 5/2001 | Moden et al. |
| 6,261,868 B1 | 7/2001 | Miller et al. |
| 6,630,371 B2 | 10/2003 | Hembree |
| 6,934,065 B2 * | 8/2005 | Kinsman ........................ 359/245 |
| 7,250,324 B2 * | 7/2007 | Hsieh et al. ..................... 438/64 |
| 7,294,565 B2 | 11/2007 | Burrell et al. |
| 7,456,093 B2 | 11/2008 | Chen et al. |
| 7,701,723 B2 | 4/2010 | Peng et al. |
| 7,718,471 B1 | 5/2010 | Zaccardi |
| 7,906,372 B2 | 3/2011 | Meadowcroft |

(Continued)

FOREIGN PATENT DOCUMENTS

| EP | 1333489 A2 | 8/2003 |
| EP | 1347323 A1 | 9/2003 |

(Continued)

*Primary Examiner* — Robert Carpenter

(57) ABSTRACT

A protective coating encapsulates bond pads disposed on a substrate of an optical communications module and extends in between the bond pads. The protective coating has characteristics that (1) increase the dielectric resistances between adjacent bond pads on the substrate, (2) protect the bond pads from moisture in the environment, and (3) prevents, or at least reduces, ion migration between adjacent bond pads. In this way, the protective coating prevents, or at least reduces, corrosion growth that can lead to impedance degradation and electrical shorts between adjacent bond pads.

18 Claims, 6 Drawing Sheets

(56) References Cited

U.S. PATENT DOCUMENTS

| | | |
|---|---|---|
| 7,955,904 B2 | 6/2011 | Meadowcroft |
| 2006/0043587 A1 | 3/2006 | Lim et al. |
| 2006/0189119 A1* | 8/2006 | Jin ............................... 438/617 |
| 2006/0262820 A1 | 11/2006 | Itoh et al. |
| 2009/0121338 A1 | 5/2009 | Seng |
| 2010/0007034 A1* | 1/2010 | Meadowcroft ................ 257/784 |
| 2010/0038660 A1 | 2/2010 | Shuja |
| 2010/0052118 A1 | 3/2010 | Galera et al. |
| 2010/0213619 A1 | 8/2010 | Uno et al. |
| 2010/0311208 A1 | 12/2010 | Sirinorakul et al. |
| 2011/0057129 A1 | 3/2011 | Yao et al. |

FOREIGN PATENT DOCUMENTS

| | | |
|---|---|---|
| JP | 06-314746 | 11/1994 |
| JP | 2001-326789 | 11/2001 |
| JP | 2007-005729 | 1/2007 |
| JP | 2008-078668 | 4/2008 |

* cited by examiner

OPTICAL COMMUNICATIONS DEVICE HAVING ELECTRICAL BOND PADS THAT ARE PROTECTED BY A PROTECTIVE COATING, AND A METHOD FOR APPLYING THE PROTECTIVE COATING

TECHNICAL FIELD OF THE INVENTION

The invention relates to optical communications devices. More particularly, the invention relates to optical communications devices such as parallel optical transmitters, receivers and transceivers for simultaneously transmitting and/or receiving multiple optical signals over multiple optical channels.

BACKGROUND OF THE INVENTION

In optical communications networks, optical transmitter modules, optical receiver modules, and optical transceiver modules are used to transmit and receive optical signals over optical fibers. In a transmit portion of such an optical module, a laser generates modulated optical signals that represent data, which are then transmitted over an optical fiber. The laser can be, for example, a Vertical Cavity Surface Emitting Laser (VCSEL) or an edge-emitting laser. In a receive portion of such a module, an optics system directs light propagating out of the end of an optical fiber onto an optical detector or photodetector, which converts the optical energy into electrical energy. A photodetector is typically a semiconductor photodiode device, such as a PIN (p-type/intrinsic/n-type) photodiode. Optical transceiver modules typically include multiple lasers for transmitting multiple data signals and multiple photodiodes for receiving multiple data signals.

An optical module is commonly assembled by mounting the optoelectronic device, i.e., laser or optical detector, on a substrate, also referred to as a leadframe. As the optoelectronic device typically comprises a microelectronic semiconductor die, electrical connections between the die and conductors on the substrate are made by a technique known as wirebonding. Wirebonding is a technique in which one end of a very fine wire, known as a bond wire, is bonded to a bond pad on the die using thermal or ultrasonic energy, and the other end is bonded to a bond pad on the substrate. A lens assembly can be aligned with the transmit or receive optical ports of the die and mounted in fixed relation to the die and substrate.

Bond wires are extremely fragile because the wires are extremely fine, i.e., very thin gauge. Rough handling of the optical assembly can easily break or dislodge a bond wire. In some optical assemblies, the bond wires are protected by an enclosure or module body that encloses the entire optical assembly. In some assemblies, the bond wires are encapsulated in a dielectric resin to protect them from external forces that can break or dislodge them.

While the aforementioned techniques may be effective at protecting the bond wires from external forces that can break or dislodge them, they are not aimed at, and are not effective at, protecting the bond wires and/or the bond pads from electro-chemical reactions/ion migration that can degrade the integrity of the bond wires and/or of the bond pads. A need exists for such a solution.

SUMMARY OF THE INVENTION

The invention provides an optical communications module having bond pads that are encapsulated in a protective coating and a method of encapsulating the bond pads in the protective coating. The optical communications module comprises a substrate having at least first and second bond pads on a surface thereof, at least one integrated circuit (IC), at least first and second electrically-conductive bond wires, and a protective coating. Each bond wire has a first end and a second end. The first end of the first bond wire is attached to the first bond pad disposed on the IC and the second end of the first bond wire is attached to the first bond pad disposed on the surface of the substrate. The first end of the second bond wire is attached to the second bond pad disposed on the IC and the second end of the second bond wire is attached to the second bond pad disposed on the surface of the substrate. The protective coating encapsulates at least the first and second bond pads disposed on the surface of the substrate and extends in between the first and second bond pads disposed on the surface of the substrate. The protective coating electrically isolates the first and second bond pads disposed on the surface of the substrate from each other.

The method comprises providing a substrate, performing a die attachment process to attach at least one IC to a surface of the substrate or to a surface of a mounting structure mounted on the substrate, performing a wire bonding process to electrically interconnect the first and second bond pads on the surface of the substrate with the first and second bond pads disposed on the IC by first and second electrically-conductive bond wires, respectively, and performing an encapsulation process to encapsulate at least the first and second bond pads disposed on the surface of the substrate with a protective coating that extends in between the first and second bond pads disposed on the surface of the substrate. The protective coating electrically isolates the first and second bond pads disposed on the surface of the substrate from each other.

These and other features and advantages of the invention will become apparent from the following description, drawings and claims.

DETAILED DESCRIPTION OF AN ILLUSTRATIVE EMBODIMENT

Figure 1:
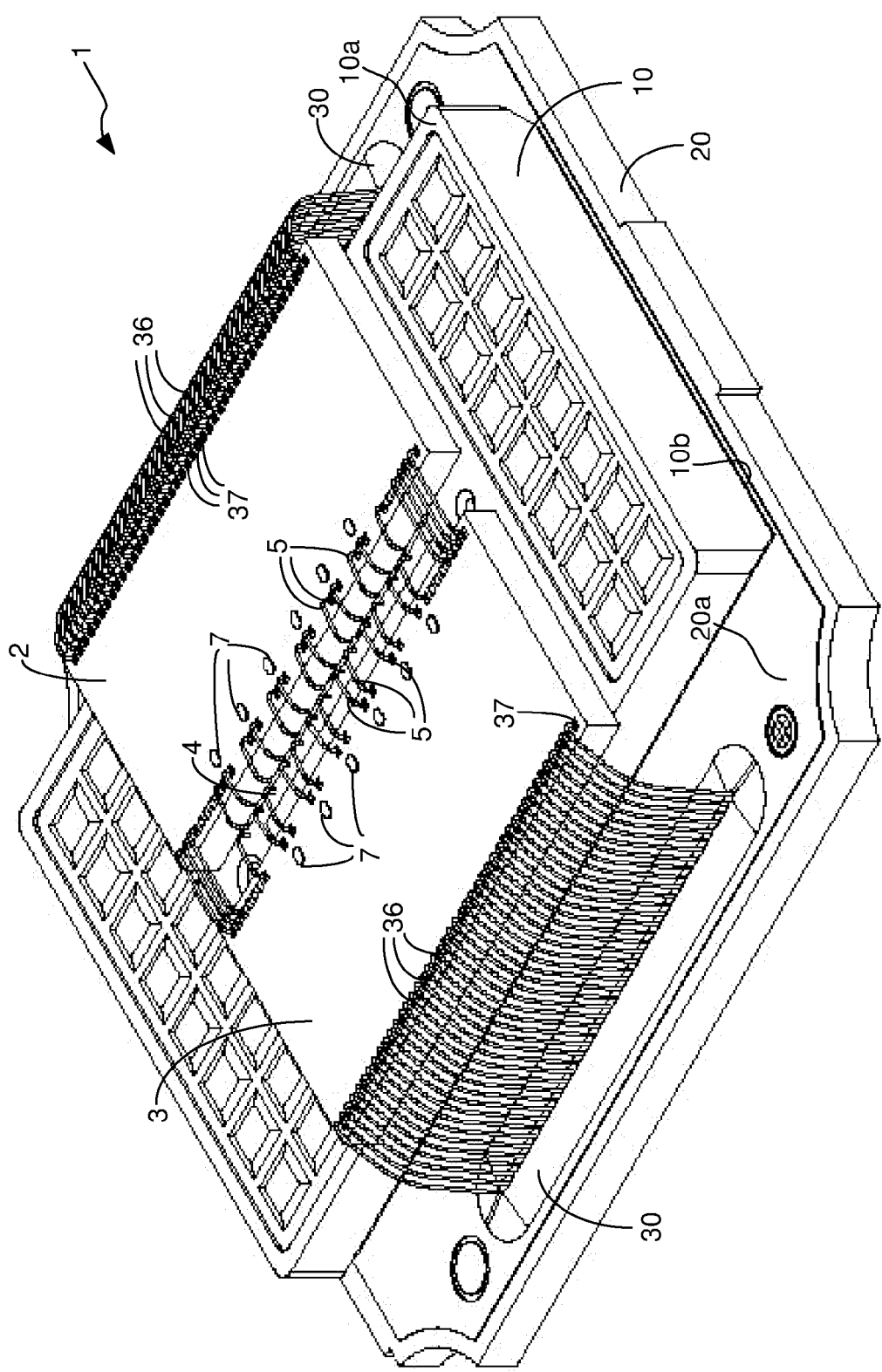
FIG. 1 illustrates a top perspective view of a parallel optical communications module in accordance with an illustrative embodiment having a protective coating thereon that encompasses bond pads disposed on a substrate of the module.
Figure 2:
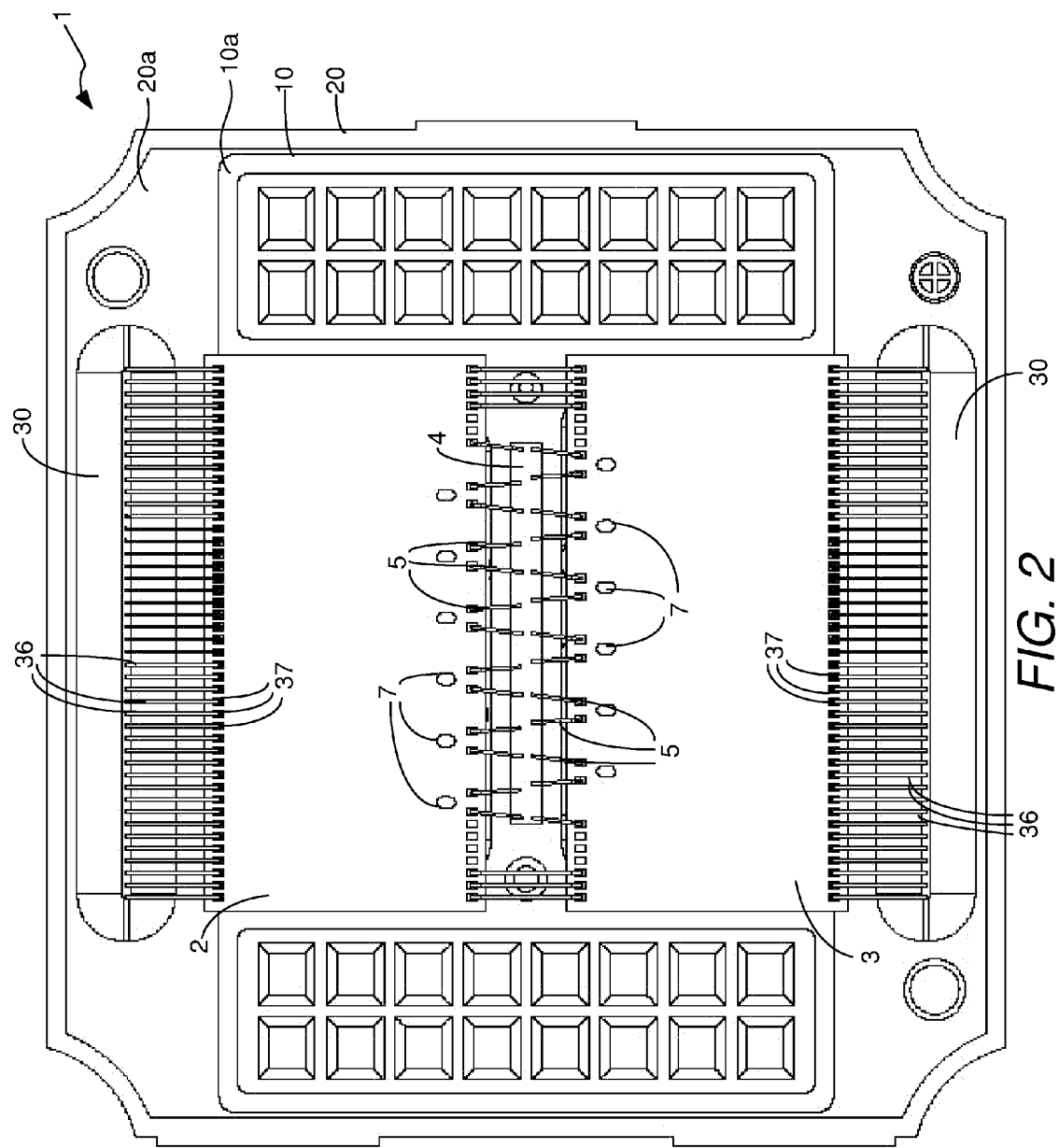
FIG. 2 illustrates a top plan view of the parallel optical communications module shown in FIG. 1 having the protective coating thereon that encompasses the bond pads disposed on the substrate of the module.
Figure 3:
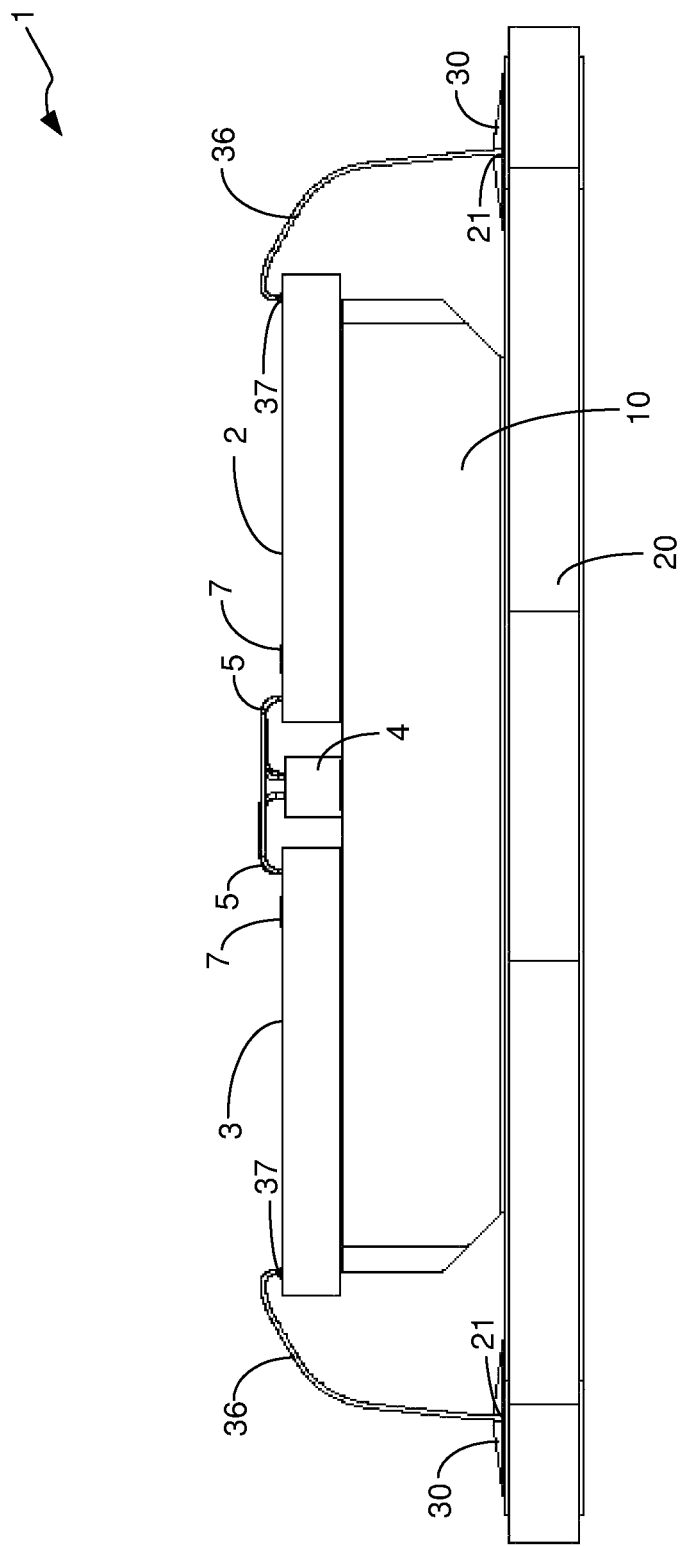
FIG. 3 illustrates a front plan view of the parallel optical communications module shown in FIG. 1 having the protective coating thereon that encompasses the bond pads disposed on the substrate of the module.
Figure 4:
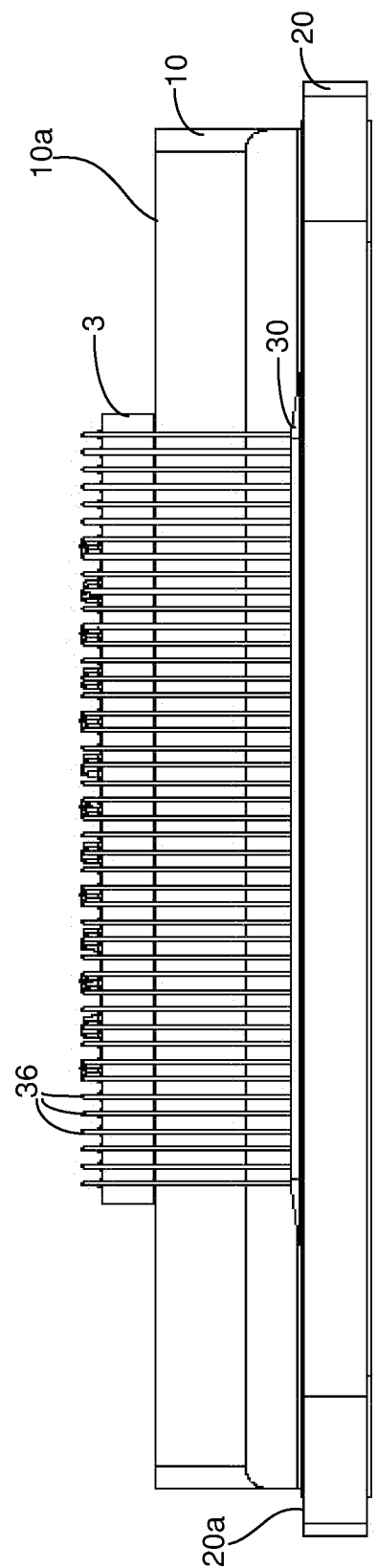
FIG. 4 illustrates a side plan view of the parallel optical communications module shown in FIG. 1 having the protective coating thereon that encompasses the bond pads disposed on the substrate of the module.

In parallel optical communications modules, there are relatively large numbers of optoelectronic devices (e.g., laser diodes or photodiodes) for transmitting or receiving optical signals over respective optical channels. Each optoelectronic device is electrically connected to at least one integrated circuit (IC) die. If the optoelectronic device is a photodiode, the IC die is typically a receiver IC die for processing the electrical signal produced by the photodiode. If the optoelectronic device is a laser diode, the IC die is typically a driver IC die for producing an electrical drive signal that drives the laser diode.

In parallel optical communications modules that have a large number of channels, the bond wires that electrically connect bond pads on the IC die to respective bond pads on the substrate are very close together due to the fact that the pitch, or distance, between adjacent bond pads is very small. In accordance with the invention, it has been discovered that this very small pitch can result in corrosion growth on some adjacent bond wires and bond pads on the substrate near where the ends of the bond wires are attached to the bond pads on the substrate. For example, in some cases, some of the adjacent bond wires are inter-IC lines, known as I$^2$C lines, which are used for serial, synchronous communications between the substrate and the driver or receiver IC. There are typically three or four I$^2$C lines, depending on how the protocol is implemented: one of these lines is a serial clock (SCL); another of the lines is a serial data (SDA) line; another line is a ground (GND) line; and another line is the voltage supply ($V_{DD}$) line.

Because the bond wires corresponding to the I$^2$C lines often have different voltage potentials between them, they create electrical fields. In addition, there is often some moisture in the air that surrounds these bond wires because the modules often are not hermetically sealed due to their compactness. Furthermore, free ions are often available to migrate around the locations where the ends of the bond wires attach to the respective bond pads on the substrate. The combination of all of these effects can create impedance degradation and electrical shorts between some of these adjacent bond wires and bond pads that results in a failure of the module to operate properly, particularly with respect to I$^2$C communications, which are consistently in biased conditions.

In accordance with the invention, a protective coating is applied to the bond pads on the substrate and extends in between adjacent bond pads. The protective coating has characteristics that (1) increase the dielectric resistances between adjacent bond pads on the substrate, (2) isolate the bond pads on the substrate from moisture in the environment, and (3) prevents, or at least reduces, ion migration between adjacent bond pads on the substrate. In this way, the protective coating prevents, or at least reduces, corrosion growth that can lead to electrical shorts between adjacent bond pads on the substrate. Illustrative embodiments will now be described with reference to an example of a parallel optical transmitter module to demonstrate the manner in which the protective coating is applied in cases where the pitch between bond wires and bond pads is very small. It should be noted, however, that the invention is not limited to any particular type or configuration of an optical communications module.

FIGS. 1-4 illustrate top perspective, top plan, front plan, and side plan views, respectively, of a parallel optical communications module 1 in accordance with an illustrative embodiment. In accordance with this embodiment, the parallel optical communications module 1 is a parallel optical transmitter. However, it should be noted that the parallel optical communications module may be a parallel optical transmitter, a parallel optical receiver or a parallel optical transceiver. In the interest of brevity, illustrative embodiments of the invention will be described with reference to the parallel optical transmitter module 1. Those skilled in the art will understand the manner in which the principles and concepts described herein in relation to the parallel optical transmitter module 1 can be applied to parallel optical receivers and parallel optical transceivers.

The parallel optical transmitter module 1 includes a mounting core 10 that serves as a mounting system for mounting at least the core components of the transmitter module 1. In accordance with this embodiment, the core components of the parallel optical transmitter module 1 include a first laser diode driver IC 2, a second laser diode driver IC 3, and a vertical cavity surface emitting laser (VCSEL) IC 4. The laser diode driver ICs 2 and 3 and the VCSEL IC 4 are mounted on an upper surface 10a of the mounting core 10. The laser diode driver ICs 2 and 3 are electrically connected to the VCSEL IC 4 by electrical conductors 5, which are typically bond wires, to enable electrical control signals and other electrical signals to be sent from the laser diode driver ICs 2 and 3 to the VCSEL IC 4. The VCSEL IC 4 has a plurality of VCSEL laser diodes (not shown) that produce a plurality of respective optical data signals based on the electrical control signals and respective electrical data signals provided to the VCSEL IC 4 by the laser diode driver ICs 2 and 3. The electrical control signals control the bias and modulation currents of the VCSEL laser diodes.

In the illustrative embodiment shown in FIG. 1, the laser diode driver ICs 2 and 3 and the VCSEL IC 4 are arranged in a balanced laser driver layout on the upper surface 10a of the mounting core 10. In the balanced laser driver layout, half of the laser diodes of the VCSEL IC 4 are driven by laser diode driver IC 2 and the other half of the laser diodes of the VCSEL IC 4 are driven by laser diode driver IC 3. It should be noted, however, that it is not necessary to use the balanced laser driver layout shown in FIG. 1.

The ICs and any other components that are mounted on the upper surface 10a of the mounting core 10 may be arranged in any desired layout. For example, the laser diode driver IC 2 could be used to drive all of the laser diodes of the VCSEL IC 4, in which case the laser diode driver IC 3 could be eliminated. Also, the invention is not limited with respect to the types of laser diodes that are used. Laser diodes other than VCELs (e.g., edge-emitting laser diodes) may be used for this purpose. The invention also is not limited with respect to the types or quantity of components that are mounted on the mounting core 10.

In the illustrative embodiment shown in FIG. 1, monitor photodiodes 7 are integrated into the laser diode driver ICs 2 and 3. These monitor photodiodes 7 monitor the optical output levels of respective ones of the laser diodes and produce corresponding electrical signals that are fed back to control logic (not shown), which uses the feedback to adjust the electrical control signals that are delivered by the laser diode driver ICs 2 and 3 to the VCSEL IC 4. These control signals cause the bias and/or modulation currents of the laser diodes to be adjusted such that the average optical output power levels of the laser diodes are maintained at substantially constant predetermined levels. However, the monitor photodiodes 7 are optional and are not required by the parallel optical communications device of the invention.

The mounting core 10 has a lower surface 10b that is attached to an upper surface 20a of a substrate 20 of the parallel optical transmitter 1. The substrate 20 is a circuit board of some type, such as a land grid array (LGA), for example. The substrate 20 has electrically-conductive bond pads 21 (FIG. 3) on the upper surface 20a thereof. The bond pads 21 (FIG. 3) disposed on the upper surface 20a of the substrate 20 are encapsulated in a protective coating 30, and therefore are not visible in FIGS. 1, 2 and 4. The manner in which the protective coating 30 encapsulates the bond pads 21 (FIG. 3) will be described below in more detail with reference to FIG. 5.

The bond pads 21 (FIG. 3) on the upper surface 20a of the substrate 20 are electrically coupled via electrically-conductive bond wires 36 to respective electrically-conductive bond pads 37 of the laser diode driver ICs 2 and 3. The ends of the bond wires 36 that are attached to the bond pads 21 (FIG. 3) disposed on the upper surface 20a of the substrate 20 are typically also encapsulated in the protective coating 30, as will be described below in more detail with reference to FIG. 5.

Figure 5:
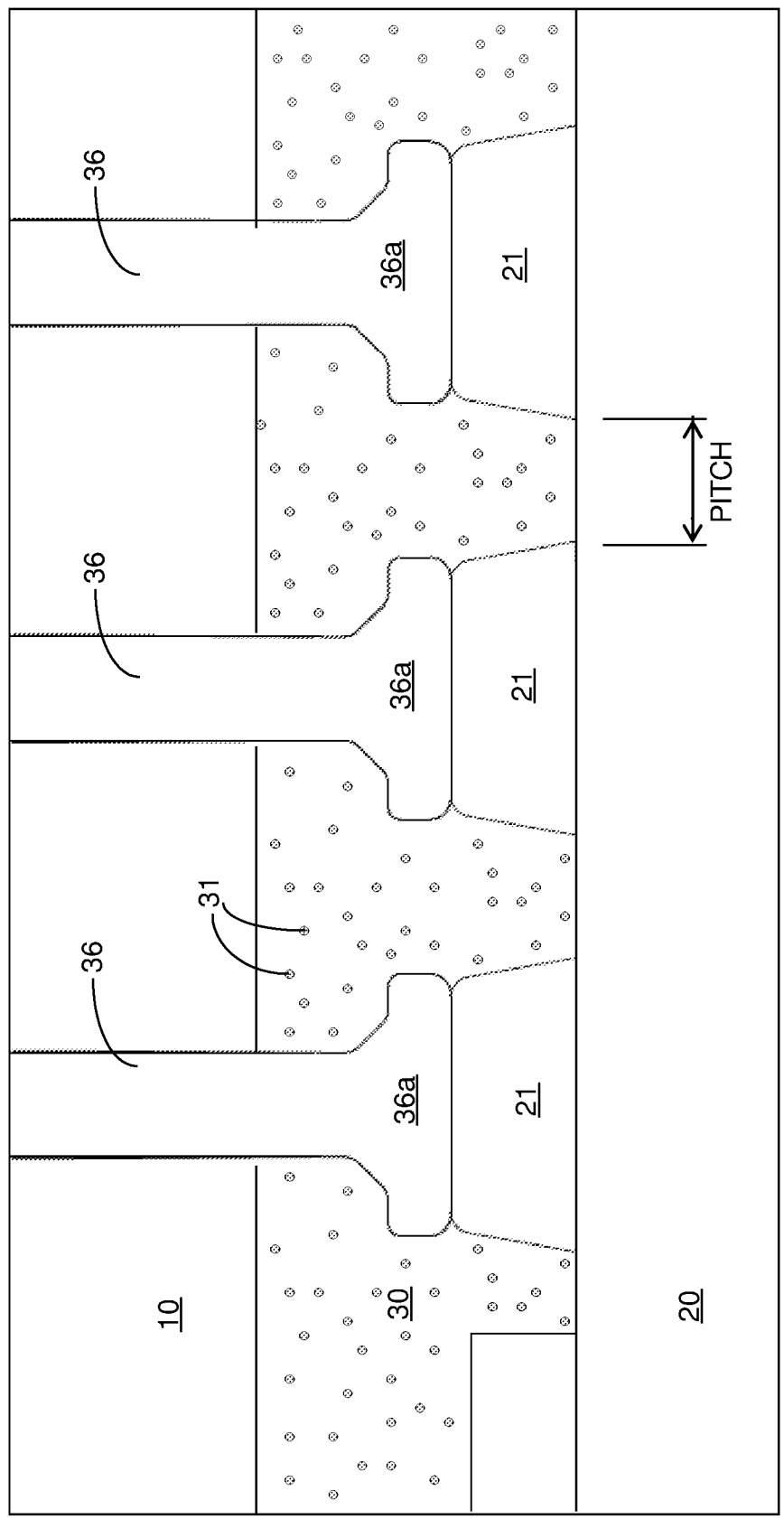
FIG. 5 illustrates a cross-sectional view of a portion of the parallel optical transmitter module shown in FIGS. 1-4 that demonstrates the manner in which the protective coating encapsulates the bond pads disposed on the upper surface of the substrate and the ends of the bond wires that are attached to the bond pads.

FIG. 5 illustrates a cross-sectional view of a portion of the parallel optical transmitter module 1 shown in FIGS. 1-4 that demonstrates the manner in which the protective coating 30 encapsulates the bond pads 21 disposed on the upper surface 20a of the substrate 20 and the ends 36a of the bond wires 36 that are attached to the bond pads 21. As indicated above, the bond pads 21 may have a pitch that is very small. This pitch, which corresponds to the distance between adjacent bond pads 21, may be, for example, between about 15 and 40 micrometers (microns). The protective coating 30 fills this space between the bond pads 21 and encapsulates the bond pads 21 and the ends 36a of the bond wires 36.

The invention is not limited to using any particular material for the protective coating 30 except that it should have properties that enable the coating 30 to: (1) adhere to the bond pads 21; (2) repel moisture to an extent that moisture from the environment is not capable of contacting the bond pads 21; (3) sufficiently increase the electrical resistance between adjacent bond pads 21 to prevent electrical shorting of adjacent bond pads 21; and (4) flow in between adjacent bond pads 21. A variety of materials, such as epoxies, for example, are suitable for this purpose. Many epoxies have dielectric constants that are sufficiently high to prevent electrical shorting between adjacent bond pads 21. Because the material must be able to flow in between adjacent bond pads, if an epoxy with filler particles 31 (FIG. 5) is used for this purpose, the filler particles 31 cannot have a size that is larger than the pitch of the bond pads 21. Also, the material that is used for the protective coating 30 must have a viscosity that is low enough to allow the material to flow between the bond pads 21, but not so low that the material flows onto other parts of the module 1 that should be free of the material. The material also should not disturb the already-bonded wires 36 or detrimentally affect the performance of the module 1. Persons skilled in the art will understand how a material that has these properties can be selected for use as the protective coating.

Figure 6:
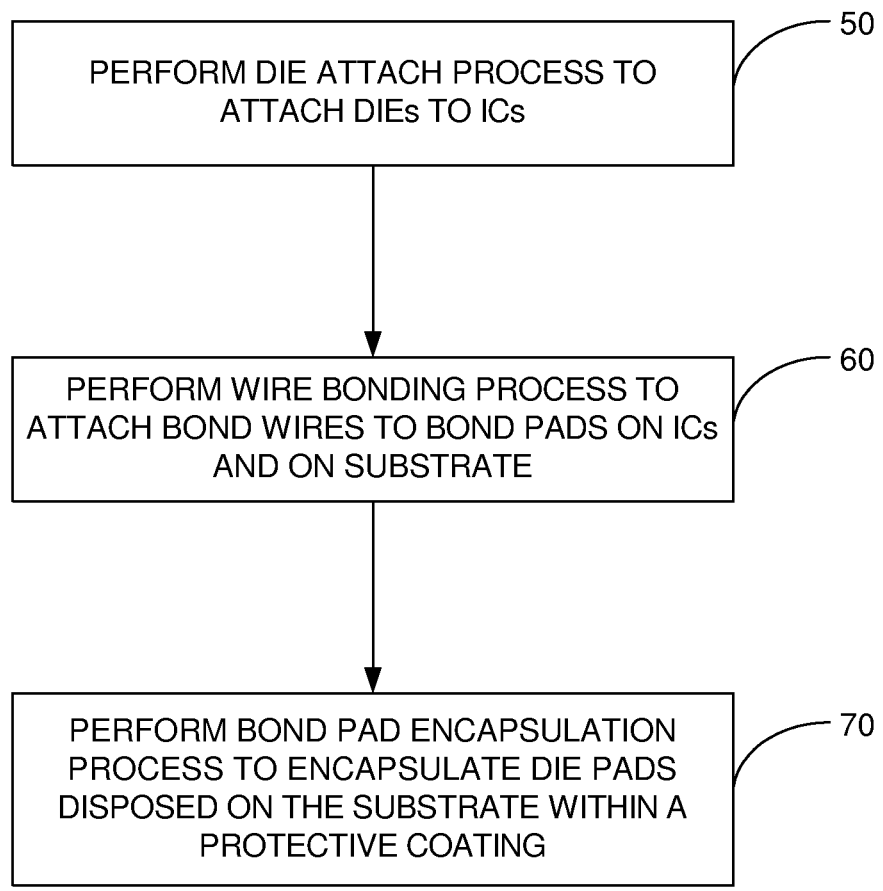
FIG. 6 illustrates a flowchart that demonstrates the method for encapsulating the bond pads in a protective coating.

FIG. 6 illustrates a flowchart demonstrating the method for applying the protective coating 30 in accordance with an illustrative embodiment. The protective coating 30 may be applied manually or by an automated process. In either case, application of the protective coating 30 should be performed in such a way that the integrity of the bond wires 36 is not detrimentally affected. Prior to applying the protective coating 30, a die attachment process is performed to attach the ICs 2-4 to the mounting core 10, as indicated by block 50. It should be noted that the mounting core 10 is optional and is shown here merely for illustrative purposes. The ICs 2-4 may instead be mounted on a leadframe or on heat sink devices that are attached to the substrate 20. After the die attachment process has been performed, a wire bonding process is performed to attach the bond wires 5 and 36 to the bond pads on the ICs 2-4 and on the substrate 20, as indicated by block 60. After the wire bonding process has been performed, an encapsulation process is performed to encapsulate the bond pads 21 disposed on the upper surface 20a of the substrate 20 in the protective coating 30. It should be noted that processes other than those represented by blocks 50, 60 and 70 may be performed before, during and/or after the processes represented by blocks 50, 60 and 70 are performed.

As indicated above, the encapsulation process represented by block 70 may be performed manually by a person or automatically by a machine. If the process is performed in automated fashion by a machine, a machine vision system (not shown) will typically be used to align the module with a dispensing tool that dispenses the protective coating 30. The dispensing tool may be a tool that is specifically designed for this purpose or it may be a tool that currently exists in the market. In the latter case, for example, an inkjet shooter may be used to shoot the coating material onto and in between the bond pads 21. The invention is not limited to using any particular tools or systems to perform the encapsulation process.

It should be noted that the invention has been described with respect to illustrative embodiments for the purpose of describing the principles and concepts of the invention. The invention is not limited to these embodiments. For example, while the invention has been described with reference to a particular module layout, the invention is not limited to this particular layout. Also, while the invention has been described with reference to a parallel optical transmitter in which all channels are transmit channels, the parallel optical communications module may instead include transmit and receive channels or only receive channels. As will be understood by those skilled in the art in view of the description being provided herein, many modifications may be made to the embodiments described herein, and all such modifications are within the scope of the invention.

What is claimed is:

1. An optical communications module comprising:

a substrate having at least first and second electrically-conductive bond pads extending upwardly from a surface of the substrate such that a channel is formed between the first and second electrically-conductive bond pads, the first and second bond pads dimensioned such that the width of each of the first and second bond pad is greater than a spacing between the first and second bond pad, the first and second bond pads being electrically coupled to respective electrical conductors disposed in or on the substrate;

at least one integrated circuit (IC) having at least first and second electrically-conductive bond pads disposed thereon, the first IC being attached to a surface of the substrate or to a surface of a mounting structure mounted on the substrate;

at least first and second electrically-conductive bond wires, each bond wire having a first end and a second end, the first end of the first bond wire being attached to the first bond pad disposed on said at least one IC, the second end of the first bond wire being attached to the first bond pad extending upwardly from the surface of the substrate, the first end of the second bond wire being attached to the second bond pad disposed on said at least one IC, the second end of the second bond wire being attached to the second bond pad extending upwardly from the surface of the substrate; and a protective coating encapsulating at least the first and second bond pads extending upwardly from the surface of the substrate and filling the channel formed between the first and second bond pads such that the protective coating electrically isolates the first and second bond pads extending upwardly from the surface of the substrate from each other.

2. The optical communications module of claim 1, wherein the protective coating also prevents moisture in the environment from coming into contact with the first and second bond pads extending upwardly from the surface of the substrate.

3. The optical communications module of claim 2, wherein the protective coating also prevents ions from migrating between the first and second bond pads extending upwardly from the surface of the substrate.

4. The optical communications module of claim 1, wherein the protective coating comprises an epoxy.

5. The optical communications module of claim 4, wherein the epoxy has a dielectric constant that is sufficiently high to prevent electrical shorting from occurring between the first and second bond pads extending upwardly from the surface of the substrate.

6. The optical communications module of claim 5, wherein the epoxy has filler particles that are smaller than a pitch between the first a second electrically-conductive bond wires.

7. The optical communications module of claim 1, wherein the spacing between the first and second bond pads extending upwardly from the surface of the substrate is between about 15 and 40 micrometers (microns).

8. The optical communications module of claim 7, wherein the spacing between the first and second bond pads extending upwardly from the surface of the substrate is about 20 microns.

9. The optical communications module of claim 1, wherein the optical communications module is a parallel optical transmitter module having multiple transmit channels.

10. The optical communications module of claim 1, wherein the optical communications module is a parallel optical receiver module having multiple receive channels.

11. The optical communications module of claim 1, wherein the optical communications module is a parallel optical transceiver module having multiple transmit and receive channels.

12. The optical communications module of claim 1, wherein the first and second electrically-conductive bond wires are part of an inter-integrated circuit ($I^2C$) interface.

13. The optical communications module of claim 1, wherein the first IC is a laser diode driver IC.

14. The optical communications module of claim 1, wherein the first IC is a receiver IC.

15. The optical communications module of claim 1, wherein the protective coating also encapsulates the second ends of the first and second electrically-conductive bond wires.

16. The optical communications module of claim 1, wherein the protective coating has qualities that cause the protective coating to adhere to the first and second bond pads extending upwardly from the surface of the substrate.

17. The optical communications module of claim 1, wherein the protective coating has qualities that cause the protective coating to increase an electrical resistance between the first and second bond pads extending upwardly from the surface of the substrate to prevent electrical shorting from occurring between the first and second bond pads disposed on the surface of the substrate.

18. The optical communications module of claim 1, wherein the protective coating has qualities that allow the protective coating to flow in the channel formed between the first and second bond pads extending upwardly from the surface of the substrate without disturbing the first and second electrically-conductive bond wires.

\* \* \* \* \*